United States Patent [19]
Hatase et al.

[11] Patent Number: 5,999,640
[45] Date of Patent: *Dec. 7, 1999

[54] ELECTRONIC PART MOUNTING APPARATUS WITH REFLECTOR WHICH OPTIMIZES AVAILABLE LIGHT

[75] Inventors: Takayuki Hatase, Fukuoka; Kenichi Ogata, Fukuoka-ken, both of Japan

[73] Assignee: Matsushita Electric Industrial Co. Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/815,124

[22] Filed: Mar. 11, 1997

[30] Foreign Application Priority Data

Mar. 15, 1996 [JP] Japan .................................... 8-059016
Mar. 15, 1996 [JP] Japan .................................... 8-059018

[51] Int. Cl.⁶ .............................. G06K 9/00; G01B 11/14
[52] U.S. Cl. ............................................ 382/151; 356/375
[58] Field of Search .............................. 29/332, 703–705, 29/709, 710, 712, 714–721, 832, 834–836, 840; 382/141, 144, 145, 147, 148, 149, 151, 152, 153, 323; 359/853; 348/87, 95, 126, 131; 356/376, 380, 386, 387

[56] References Cited

U.S. PATENT DOCUMENTS

| | | | |
|---|---|---|---|
| 4,858,308 | 8/1989 | Komori | 29/740 |
| 4,867,569 | 9/1989 | Mohara | 356/375 |
| 4,934,798 | 6/1990 | Bunch | 359/19 |
| 5,131,139 | 7/1992 | Oyama et al. | 29/721 |
| 5,224,262 | 7/1993 | Takaichi et al. | 29/721 |
| 5,559,727 | 9/1996 | Deley et al. | 364/528.14 |
| 5,619,328 | 4/1997 | Sakurai | 356/375 |
| 5,864,944 | 2/1999 | Kashiwagi et al. | 29/833 |

*Primary Examiner*—Amelia Au
*Assistant Examiner*—F. E. Cooperrider
*Attorney, Agent, or Firm*—Stevens, Davis Miller & Mosher, LLP

[57] ABSTRACT

An apparatus for mounting an electronic part includes a reflector located in the rear of an electronic part held by a nozzle on a transferring head, and an image reading device for observing an electronic part held and moved by the transferring head. The image reading device picks up an image from the electronic part. The picked-up image is recognized so as to detect a position of the electronic part with which the motion of the transferring head is controlled. The image reading device includes a line sensor for observing from below the electronic part held by the nozzle of the transferring head, a transmissive illuminating unit for irradiating light onto the reflector so as to make the background of the electronic part bright; a direct illuminating unit for irradiating from below the lower surface of the electronic part passing above the line sensor. Light obtained by emitting a band-like beam from either the transmissive illuminating unit or the direct illuminating unit and then reflecting the same upon the reflector or upon the lower surface of the electronic part is introduced into the line sensor so as to pick up an image from the electronic part attracted by the nozzle.

5 Claims, 8 Drawing Sheets

ELECTRONIC PART MOUNTING APPARATUS WITH REFLECTOR WHICH OPTIMIZES AVAILABLE LIGHT

BACKGROUND OF THE INVENTION

The present invention relates to an apparatus for and a method of automatically mounting electronic parts on a circuit board.

RELATED ART

Conventional electronic parts mounting devices comprise an image reading device for observing an electronic part picked up from a part feeder, and an image processing part for determining a positional deviation between a present position of the electronic part and a predetermined mounting position in order to compensate the position of the electronic part for the positional deviation before it is mounted on a circuit board. Two kinds of image reading devices have been used as the above-mentioned image reading device, one of which is composed of an area type CCD camera for obtaining a two-dimensional image from an electronic part for analysis, and the other one of which is composed of a line sensor across which an electronic sensor is passed, for sequentially obtaining several line-like one-dimensional images which are then combined together so as to constitute a two-dimensional image that is then analyzed.

The electronic part mounting device should incorporate an image reading device which can obtain an image having a high viewing field and a high resolution in order to cope with several electronic parts having various sizes ranging from an extremely small size to a very large size having several lead wires.

In view of this point, an electronic part mounting apparatus incorporating an image reading device having the above-mentioned one-dimensional line sensor has been widely used since the line sensor can easily obtain an image having a high resolution, in comparison with an area type CCD camera.

In such an image reading device, a reflector for reflecting light is arranged in the rear of a nozzle for attracting an electronic part (or in the rear of the electronic part), and light is irradiated from a ring-like light source onto the reflector, uniformly over the entire surface of the latter so as to make the background of an electronic part bright in order to observe a silhouette of the external shape of the electronic part.

However, these days, the transferring speed of an electronic part has been increased in order to shorten the tact time of shift operation of the electronic part mounting apparatus, and as a result, the time by which an electronic part passes across the line sensor becomes shorter. Accordingly, the conventional electronic part mounting apparatus tends to have an insufficient capacity of light incident upon the line sensor, causing an inferior image quality so that it becomes difficult to precisely recognize an electronic part. It is considered as one solution to simply increase the volume of light, but this would inevitably result in side effects such as shorter useful life of an illumination device and increased power consumption.

Further, the observation and analysis of an electronic part can depend upon the kind of electronic part involved, such as a BGA (ball-grid-array) type electronic part so that light is directly irradiated onto the lower surface of the electronic part in order to brightly illuminate terminals at the lower surface of the electronic part for picking up an image from the electronic part. However, such direct illumination results in a more serious problem such that the light volume becomes insufficient as mentioned above.

SUMMARY OF THE INVENTION

Accordingly, one object of the present invention is to provide an electronic part mounting apparatus which can mount an electronic part through an analysis of a clear image from an electronic part even though the electronic part is moved at a high speed, relative to the line sensor.

To that end, according to the present invention, there is provided an electronic part mounting apparatus comprising a positioning means for positioning a circuit board, a part feeder for feeding electronic parts, a transfer head having a nozzle, for picking up an electronic part from the part feeder with the nozzle, and mounting the same onto the circuit board, an image reading device carried on the transferring head, for observing the electronic part moving together with the transferring head, the image reading device picking up an image from the electronic part so that the image is recognized in order to detect a position of the electronic part, and the motion of the transferring head is controlled in accordance with this position, and a reflector carried on the transferring head and located above the electronic part attracted by the nozzle, the image reading device further comprising: a line sensor for observing the electronic part attracted and moved by the nozzle, from below, first and second illuminating means arranged opposite sides of the line sensor, being spaced in the longitudinal direction of the line sensor, and a background illuminating means for emitting a band-like beam which widens in a direction in parallel with the longitudinal direction of the line sensor, and for irradiating the band-like beam onto the reflector passing above the line sensor, from below, a direct illuminating means for emitting a band-like beam which widens in a direction parallel with the longitudinal direction of the line sensor, and for irradiating the same onto the lower surface of the electronic part attracted by the nozzle and passing above the line sensor, from below, wherein a band-like beam is emitted from either the background illuminating means or the direct illuminating means, and is reflected by the reflector or the lower surface of the electronic part onto the line sensor in order to pick an image from the electronic part attracted by the nozzle.

Further, in an electronic part mounting apparatus according to the present invention, an image reading device comprises a line sensor for observing an electronic part attracted and moved by a nozzle in a transferring head, from below, and a first illuminating means and a second illuminating means arranged on opposite sides of the line sensor, being spaced from each other in the longitudinal direction of the line sensor, and a background illuminating means for emitting a band-like beam which widens in a direction parallel with the longitudinal direction of the line sensor, and for irradiating a reflector passing above the line sensor, from below, incorporated integrally with the nozzle of the transferring head and having a plurality of principal surfaces for reflecting band-like beams from the first and second light illuminating means onto the line sensor, wherein a band-like beam emitted from the background illuminating means and reflected by the reflector is led into the line sensor so as to pick up a silhouette image from the electronic part attracted to the nozzle.

Further, a method of mounting an electronic part comprises the steps of turning a reflector so as to set a direction of the reflector in order to reflect band-like beams emitted from a first and a second illuminating means onto a line sensor, moving an electronic part attracted by a nozzle in a direction across the line sensor so as to pick up a silhouette image of the electronic part, and detecting a positional deviation of the electronic part in accordance with the picked-up image; and compensating a position of the electronic part for the positional deviation, and thereafter mounting the electronic part onto a circuit board.

The present invention will be detailed in preferred embodiment form with reference to the drawings in which

Figure 1:
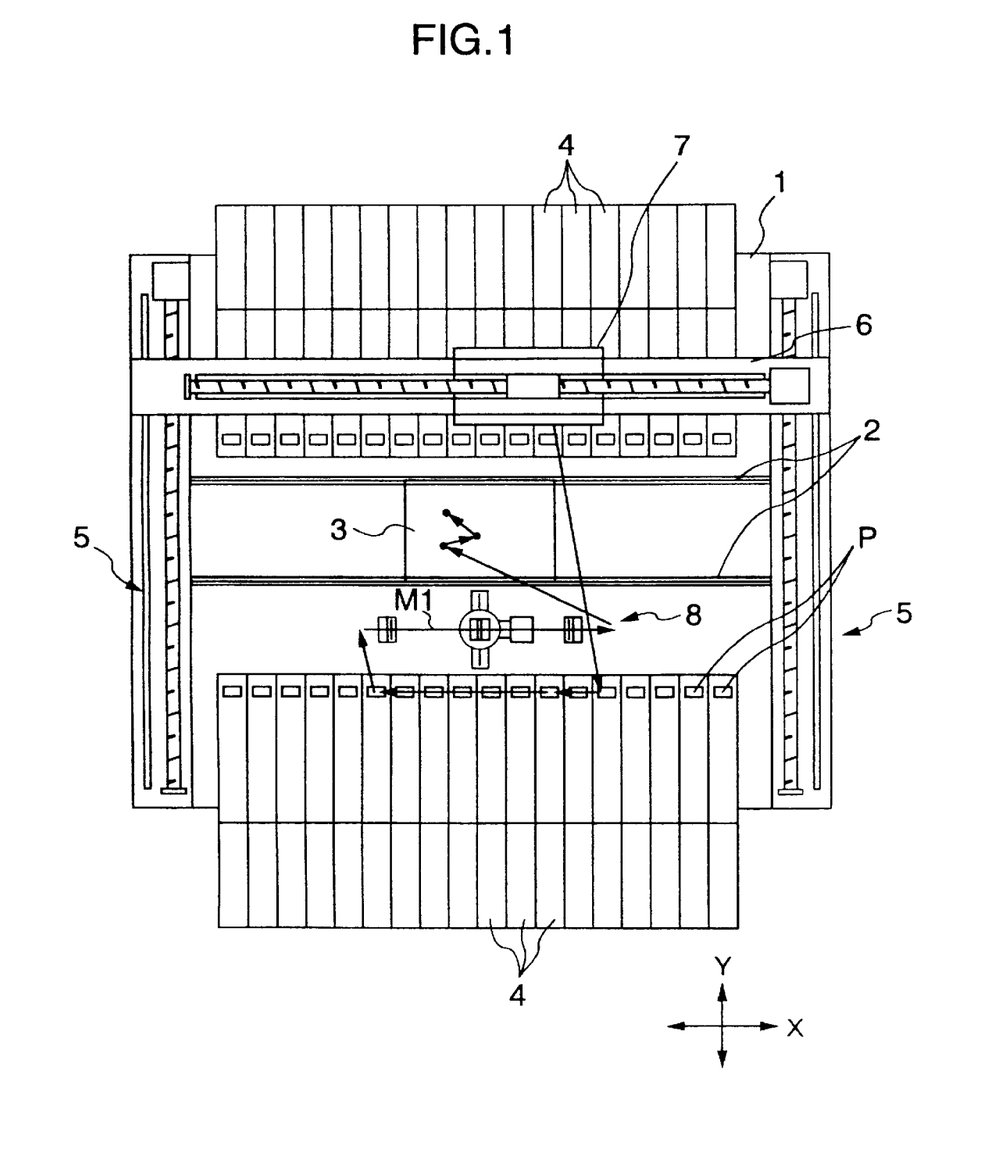
FIG. 1 is a plan view illustrating an electronic part mounting apparatus in a first embodiment of the present invention.

DESCRIPTION OF PREFERRED EMBODIMENTS:

Referring to FIG. 1, a conveyer 2 is laid in the center part of a base 1 in parallel with a direction X, the conveyer 2 being used as means for conveying and positioning a circuit board 3. Part feeders 4 for feeding electronic parts P are arrayed in the front and rear parts of the base 1, on opposite sides of the conveyer, facing one another. Y-axial shafts 5 are arranged on the base, and an X-axial shaft 6 is carried on the Y-axial shafts 5. The X-axial shaft 6 and the Y-axial shafts 5 are incorporated thereto with screw feed mechanisms, and accordingly, the X-axial shaft 6 is moved in the direction Y, and a transferring head 7 is moved in the direction X. Accordingly, when the X-axial shaft 6 and the X-axial shaft 5 are driven, the transferring head 7 is moved in both direction X and direction Y.

Typical moving paths of the transferring head are indicated by the arrows shown in FIG. 1, and below a recognizing path M1 of these moving paths, an image reading device 8 is provided.

Figure 2:
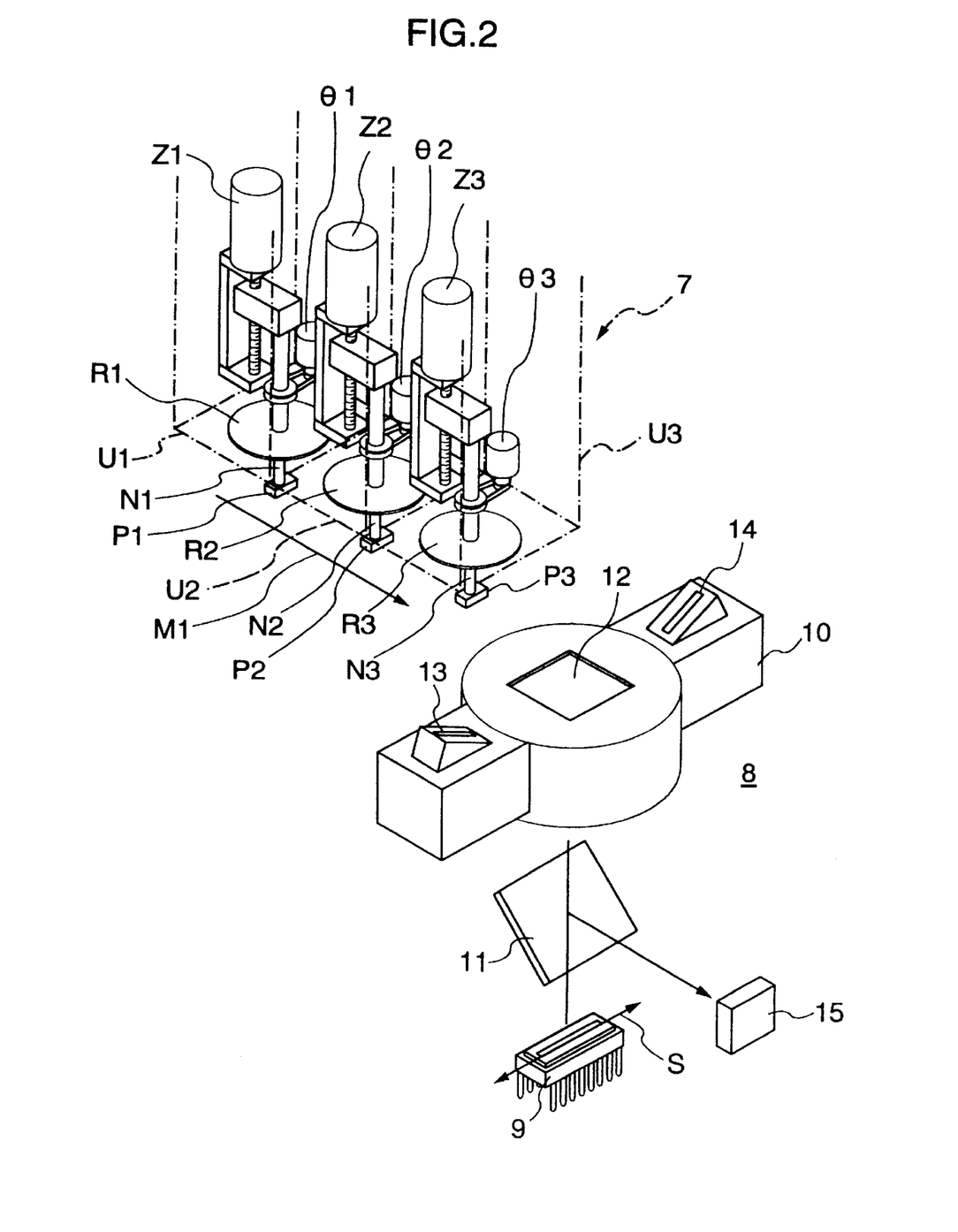
FIG. 2 is a perspective view illustrating a transferring head and an image reading device shown in FIG. 1.

Next, referring to FIG. 2, explanation will be made of the arrangement of the transferring head 7 and the image reading device 8. As shown in FIG. 2, the transferring head 7 has three units U1 to U3 in this embodiment. Each of the units U1 to U3 is composed of a nozzle N1 to N3 for attracting at its lower end an electronic part P1 to P3, a motor Z1 to Z3 for elevating the nozzle N1 to N3, a rotating motor θ1 to θ3 for rotating the nozzle N1 to N3 in a horizontal plane by an angle θ, and a reflector R1 to R3 journalled coaxial with the nozzle N1 to N3, and located above the electronic part P1 to P3. An upright feed screw is coupled to the rotary shaft of each of the elevating motors Z1 to Z3, and by rotating the feed screw, the nozzle N1 to N3 is elevated and lowered so as to control its height.

Figure 3:
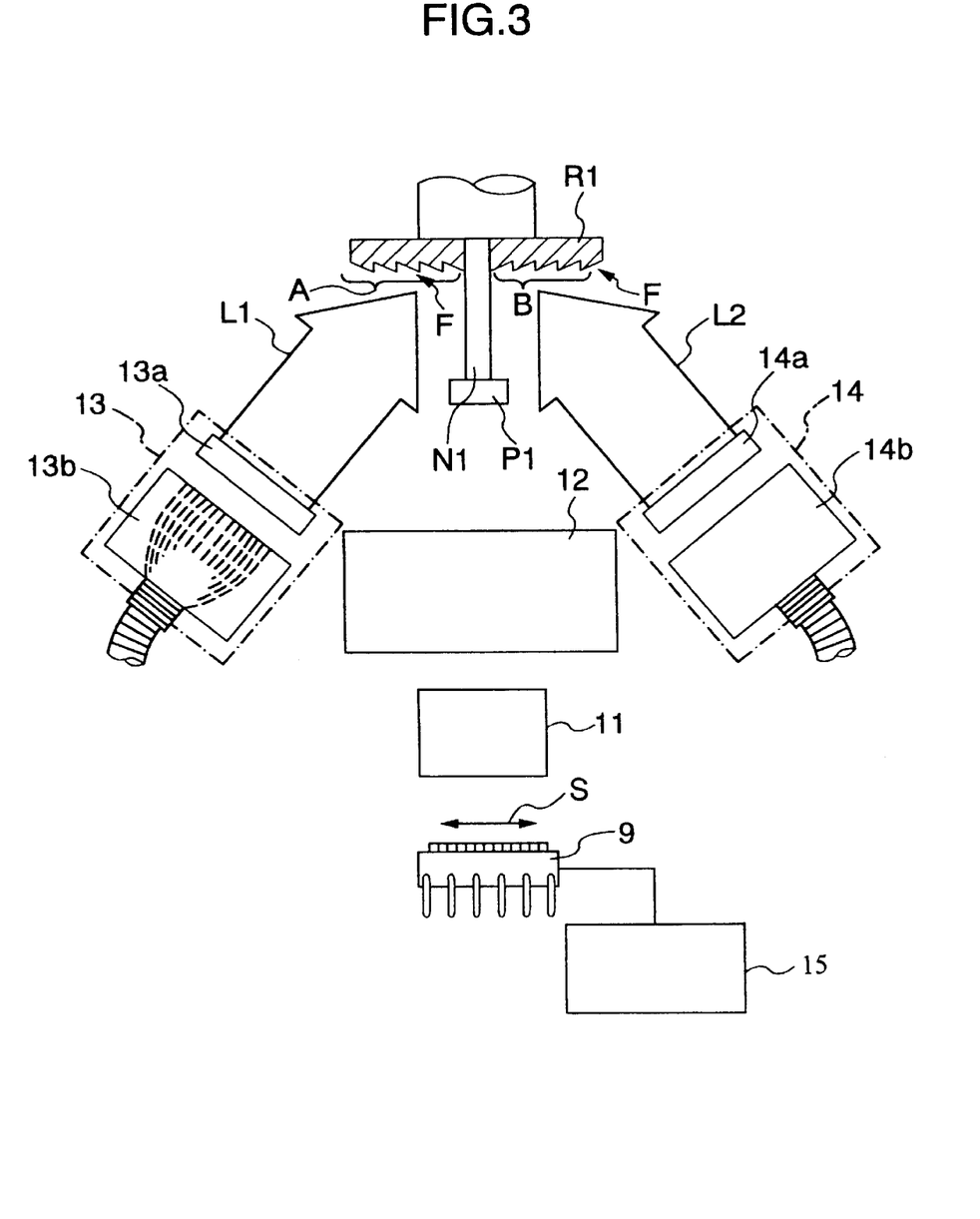
FIG. 3 is a view for explaining operation of the image reading device shown in FIG. 1.

The image reading device 8 is composed of a light source unit 10 including at its center part a telecentric lens 12, a first illuminating part 13 and a second illuminating part 14 on opposite sides of the telecentric lens 12, for emitting band-like beams above the center axis of the telecentric lens 12. As shown in FIG. 3, each of the first illuminating part 13 and the second illuminating part 14 has a focusing lens 13a, 14a and a line-like illuminating means 13b, 14b, and a first band-like beam L1 having passed through the focusing lens 13a is irradiated onto a first reflecting part A on the left side of the reflector R1 in the unit U1, and a second band-like beam L2 having passed through the focusing lens 14a is irradiated onto a second reflecting part B on the right side of the reflector R1.

A half-mirror 11 for splitting the light beam having passed through the telecentric lens 12 into a vertically directed beam and a horizontally directed beam is provided, and a line sensor 9 formed of a one-dimensional CCD is arranged direct below the telecentric lens 12, having a main scanning direction S directed in a direction orthogonal to the recognizing path M1. It is noted that the horizontally directed beam split by the half-mirror 11 is adapted to be incident upon a two-dimensional CCD 15 for allowing the worker to monitor an observing condition. An image picked up by the line sensor 9 is delivered to an image recognizing part which is not shown, so as to recognize a position of an electronic part. The first illuminating part 13 and the second illuminating part 14 which are arranged on both sides of the line sensor 9, being spaced in the longitudinal direction of the line sensor 9, constitute a transmissive illuminating part for emitting band-like beams which widen in a direction parallel to the longitudinal direction of the line sensor 9, and for irradiating the band-like beams onto the reflector R1 passing above the line sensor 9, from below.

Further, a third illuminating part 20 and a fourth illuminating part 21 (see FIG. 7) are arranged in the front and rear of the light source unit 10 on the recognizing path M1. The third illuminating part 20 and the fourth illuminating means 21 emit band-like beams which widen in a direction parallel to the longitudinal direction of the line sensor 9, and irradiate the lower surface of the electronic part P1 to P3 attracted to the nozzle N1 to N3 and passing above the line sensor 9, from below.

Figure 4:
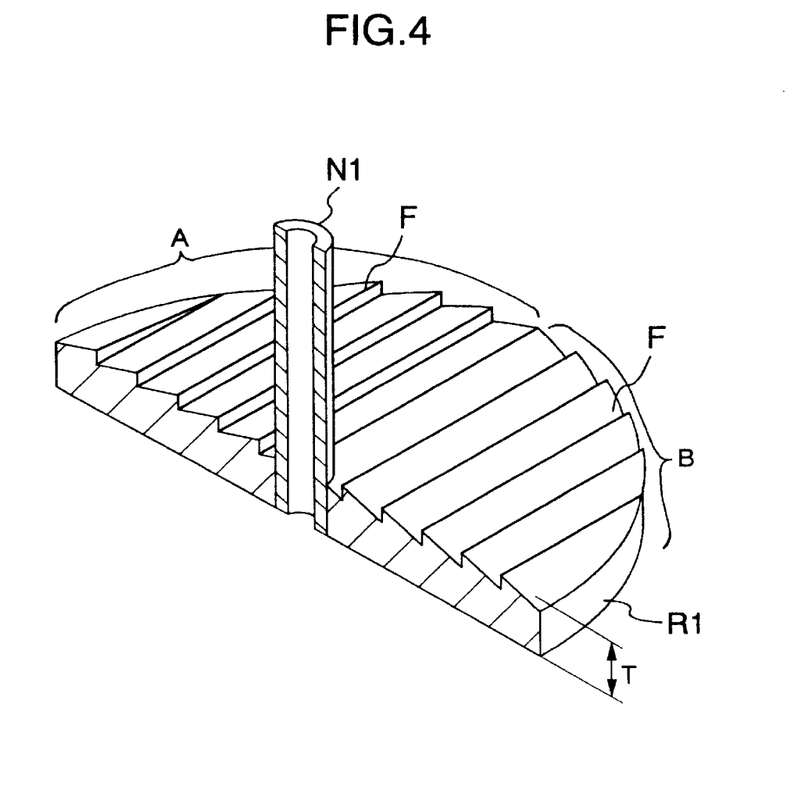
FIG. 4 is a perspective view illustrating a reflector shown in FIG. 1.
Figure 5:
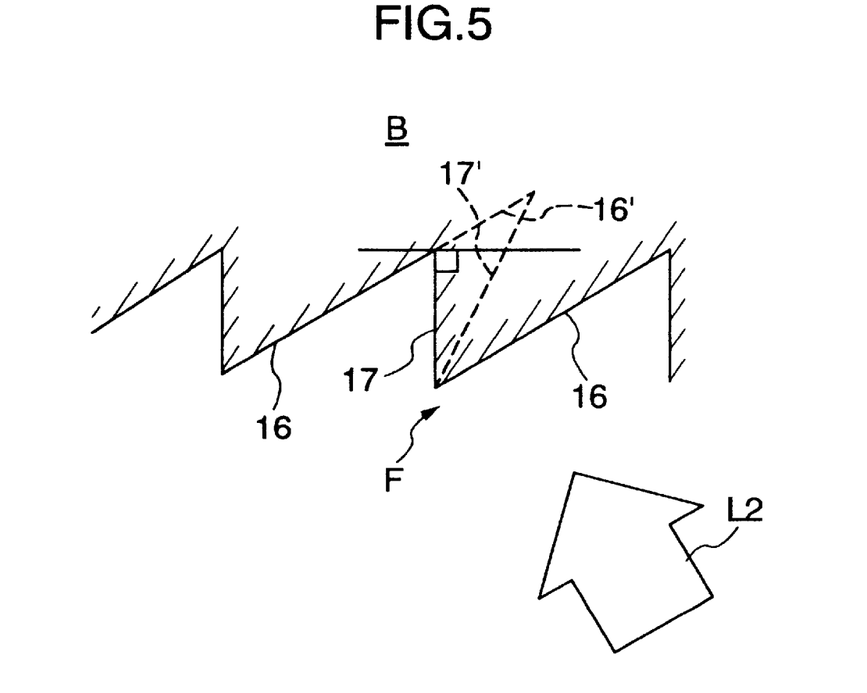
FIG. 5 is a view for explaining the reflector shown in FIG. 1.

Next, explanation will be made of the reflector with reference to FIGS. 4 to 6. As shown in FIG. 4, the reflector R1 is integrally incorporated in its center part with the nozzle N1 piercing therethrough, the first reflecting part A and the second reflecting part B are defined by a center line as a boundary passing through the nozzle N1, symmetric with each other about the center line. Each of the first and second parts A, B has a plurality of stepped parts F which are arranged in parallel with each other along the lower surface of the reflector at uniform pitches. FIG. 5 shows a sectional shape of the second reflecting part B in an enlarged view. Since the second band-like beam L2 is irradiated onto the second reflecting part B, the principal surfaces 16, onto which the second band-like beam L2 is irradiated, are formed inclined with respect to the horizontal plane (XY plane) so as to totally reflect the second band-like beam L2 in a vertically downward direction. With this arrangement, the reflected light from the reflector R1 to R3 has a directivity which is directed toward the line sensor 9 in order to efficiently lead the beam to the line sensor 9. Further, the first band-like beam L1 and the second band-like beam L2 emitted from the first illuminating part 13 and the second illuminating part 14 are totally reflected by the reflector R1 onto the line sensor 9 so as to increase the volume of light incident upon the line sensor 9.

Meanwhile, subsurfaces 17 located on the rear sides of the principal surfaces 16 are upright at a right angle to the horizontal plane (solid line), or are inclined at an angle with less difference from the angle of inclination of the principal plane, than the right angle.

Figure 6:
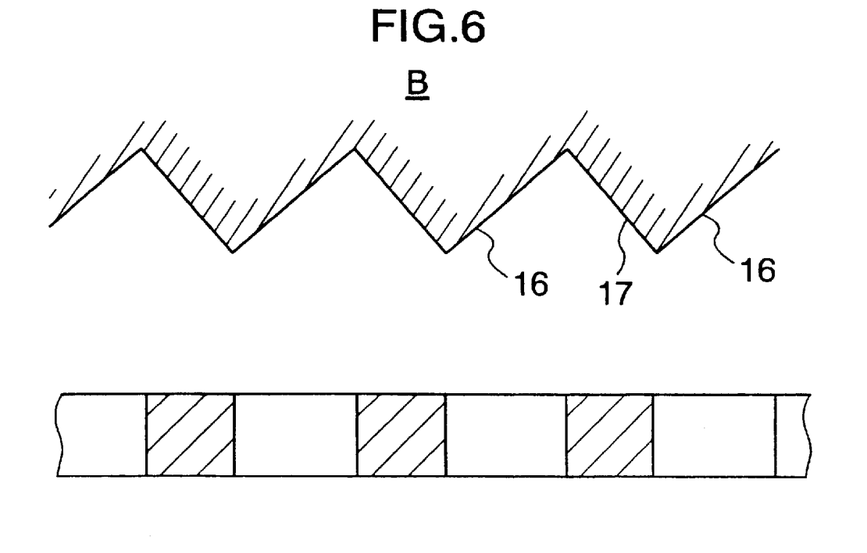
FIG. 6 is a view for explaining the reflector shown in FIG. 1.

The reason is that, as shown in FIG. 6. If the inclination of the subsurfaces 17 is set to be gentle, although light is totally reflected so as to be bright directly below the principal surfaces 16, nevertheless the subsurfaces 17 generally do not reflect light directly below. Thus the brightness becomes nonuniform, and accordingly, an obtained image includes stripes so as to hinder precise recognition.

More particularly, in the image reading device in this embodiment, the principle surfaces 16 constituting the stepped part F are adapted to totally reflect the band-like beam L2 right below, and further, the subsurfaces 17 in the rear of the principal surfaces 16, are inclined at a right angle to the principal plane or at an angle which is inclined to the peripheral surfaces 16 at an angle less than the right angle. Accordingly, it is possible to obtain an image having a bright and uniform image with no stripes, thereby making it possible to maintain the accuracy of recognition at a high degree. Further, since each of the first and second reflecting parts A, B is composed of a plurality of principal surfaces, the thickness T (FIG. 4) of the reflector R1 can be decreased so as to conveniently decrease the size of the transferring head in comparison with an arrangement wherein each of the first and second reflecting parts A, B is composed of a single surface.

Figure 7:
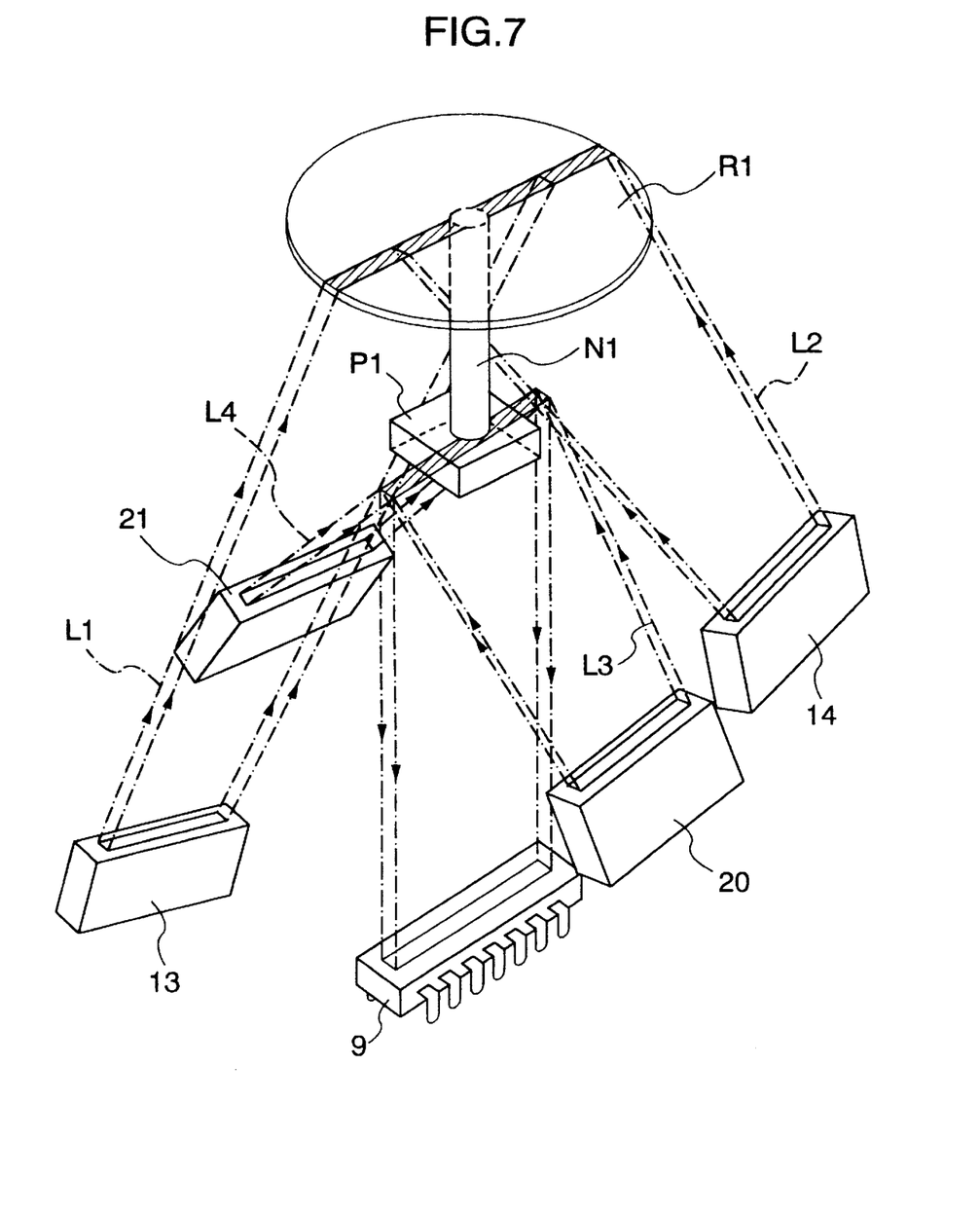
FIG. 7 is a perspective view illustrating the image reading device shown in FIG. 1.

Next, referring to FIG. 7, explanation will be made of the illuminating positions of the band-like beams emitted from the transmissive illuminating part or the direct illuminating part. It is noted that FIG. 7 shows that both the transmissive illuminating part and the direct illuminating part are operated for the purpose of explanation, but these illuminating parts are alternatively operated in accordance with a kind of an electronic part so that both are not usually simultaneously operated. That is, only the transmissive illuminating part is operated in the case of observation of a silhouette image of an electronic part while only the direct illuminating part is operated in the case of observation by irradiating the lower surface of an electronic part.

Now referring to FIG. 7, in the transmissive illuminating part, the first illuminating part 13 and the second illuminating part 14 emit the first band-like beam L1 and the second band-like beam L2, respectively, to the reflector R1. It is noted that an area through which the line sensor 9 receives reflecting light is limited to a narrow rectangular area. Accordingly, the first band-like beam L1 and the second band-like beam L2 are concentrated in this area and are overlapped with each other on the recognizing path M1 (aligned with the locus of the center of the nozzle N1 as shown in FIG. 7). This will be hereinbelow explained with reference to FIG. 8.

Further, in the direct illuminating part, the third illuminating part 20 and the fourth illuminating part 21 emit a third band-like beam L3 and a fourth band-like beam L4 to the rectangular area through which light is incident upon the line sensor 9, within a plane in which the lower surface of an electronic part passes.

By the way, the heights (thicknesses) of electronic parts differ from one another, depending upon the kinds thereof. However, the focal depth of the image reading device 8 is constant, and accordingly, the lower surface of an electronic part passing above the image reading device 8 should be set to pass at a constant height measured from the line sensor 9.

Figures 8A, 8B:
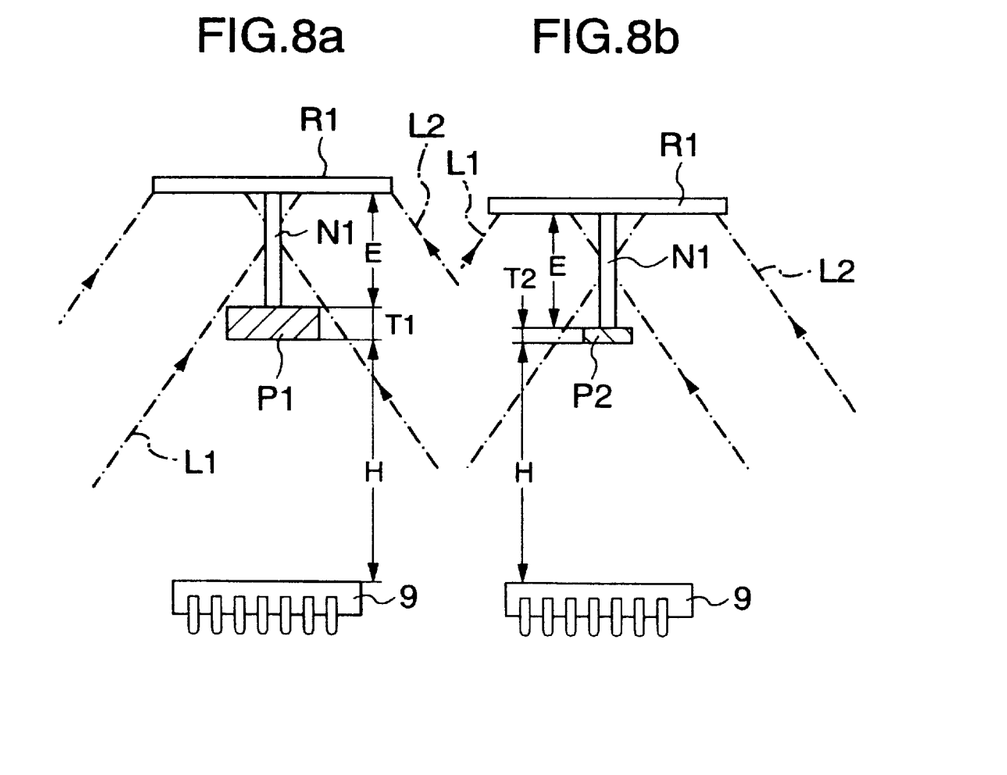
FIGS. 8a to 8d are views for explaining operation of the electronic part mounting apparatus shown in FIG. 1.
Figure 8C:
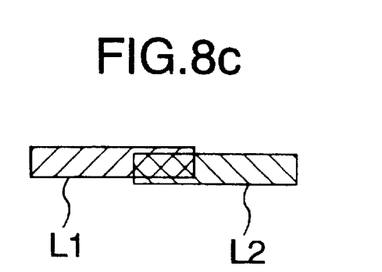

When the height T1 of an electronic part is high, in order to set the lower surface of the electronic part P1 at a constant height measured from the line sensor 9, as shown in FIG. 8a, the height of the reflector R1 becomes E+T1 where E is the height of the nozzle N1. At this time, the first band-like beam L1 and the second band-like beam L2 irradiated upon the reflector R1 overlap with each other on the recognizing path M1, and accordingly, as shown in FIG. 8c, the area (viewing field), through which light is incident upon the line sensor 9, in the reflector R1 is brightly irradiated in its entirety. Meanwhile, as shown in FIG. 8(b), if the height T2 of an electronic part P2 is low, when the lower surface of the electronic part P2 is set at the constant height H measured from the line sensor 9, the reflector R1 is set at a height E+T2 measured from the lower surface of the electronic part P2. At this time, the first band-like beam L1 and the second band-like beam are superposed with each other at the reflector R1 as shown in FIG. 8d.

Figure 8D:
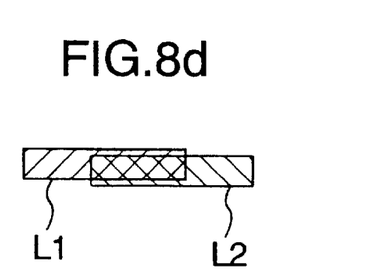

It is clearly understood from the comparison of FIG. 8c with FIG. 8d that the part (shaded area) in which the first and second band-like beams overlap with each other becomes narrow in a case in which the reflector R1 is located at a relatively high position as the height of an electronic part is high (8c) in comparison with the case in which the reflector R1 is located at a relatively low position as the height of an electronic part is low (FIG. 8d). Should the height of the reflector R1 become higher, this overlapping area would disappear, and accordingly, a dark area, where neither the first band-like beam L1 nor the second band-like beam L2 is irradiated, would be produced. This dark area, if present, is detriment to efficient recognition of an electronic part.

Thus, although the height of the reflector R1 passing above the line sensor 9 varies in dependence upon a height of an electronic part, a bright area should be formed indiscretely at the lower surface of the reflector R1 by the first and second band-like beams L1, L2 even at any height of the reflector. Accordingly, even though an electronic part has a highest height among electronic parts to be mounted, if a first illuminating part 13 and a second illuminating part 14 are arranged in order to sufficiently ensure such an overlapping area, the transmissive illumination can be made without hindrance, irrespective of a kind of the electronic part.

Figure 9:
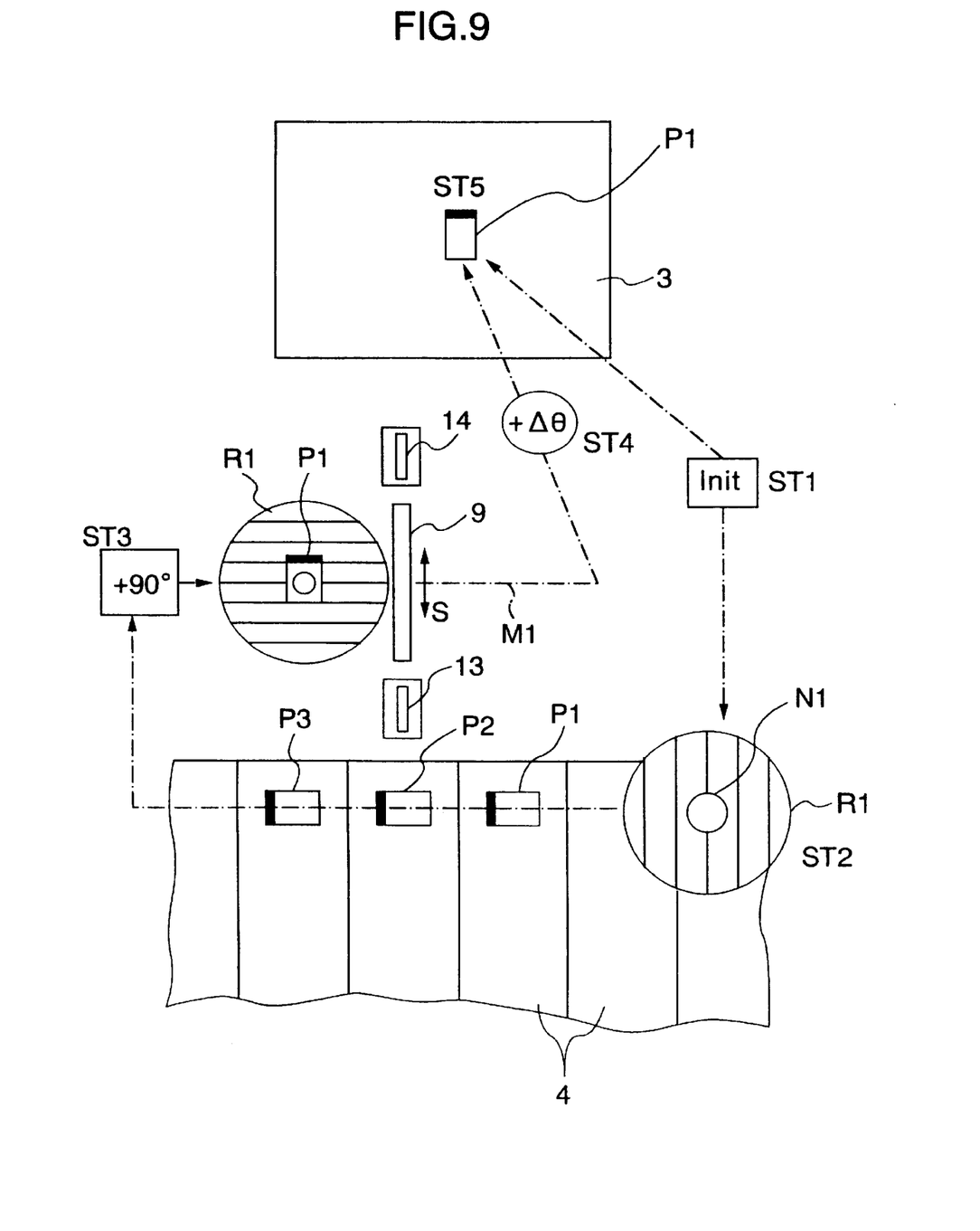
FIG. 9 is a plan view for explaining a method of mounting an electronic part, according to the present invention.

Next, explanation will be made of a method of mounting an electronic part in this embodiment with reference to FIG. 9 in the case in which an electronic part P1 fed from an part feeder 4 is mounted on a circuit board 3 in a preset direction θ by the nozzle N1 (for example, θ=90 deg.). It is noted that the clockwise direction is taken as a positive direction. Further, the direction of the reflector R1 is set to zero at which the reflector passes above the line sensor 9, and the directions of electronic parts in the part feeders 4 are set to zero. At step ST1, the angles of the nozzle N1 and the reflector R1 are initialized. Next, the direction of the reflector R1 is turned on the way to ST2 in the vicinity of a part feeder 4, and the electronic part is picked up. At this time, the direction of the reflector R1 differs from the direction of the electronic part mounted on the circuit board 3 by −θ or −90 deg.

At step ST3, the reflector R1 is turned by +θ or +90 deg. so as to allow the directions of the stepped parts F to be orthogonal to the main scanning direction S, that is, it is in the direction of the recognizing path M1. Accordingly, the direction of the reflector R1 is set as shown in FIG. 3 with respect to the first emitting part and the second emitting part, and the line sensor 9. By making the electronic part P1 cross the line sensor 9 in such a condition that the first and second light emitting parts are energized, a silhouette image can be obtained by the line sensor 9 from the electronic part P1 attracted by the nozzle N1. Since the electronic part P1 is turned by an angle of +90 deg. at step ST3, an image can be obtained from the electronic part P1 directed at an angle of 90 deg. (in the preset direction) by the line sensor 9.

Next at step ST4, an angular deviation $\Delta\theta$ with respect to the preset direction $\theta$ ($\theta$=90 deg.) of the electronic part P1, and positional deviations $\Delta X$, $\Delta Y$ of the electronic part P1 with respect to the rotating center of the nozzle N1 are calculated. Then, the motor $\theta 1$ is rotated on the way of movement of the nozzle N1 onto the circuit board P1 so as to compensate the position of the electronic part P1 for the angular deviation $\Delta\theta$, and then to compensate the movement of the nozzle N1 for the positional deviations $\Delta X$, $\Delta Y$. Then the electronic part P1 is mounted on the circuit board 3. Further, the procedure is returned to step ST1.

The description has been made as to the single nozzle N1 in order to simplify the explanation of this embodiment. However, as mentioned above, the transferring head 7 has three units U1 to U3 respectively having nozzles N1 to N3, and reflectors R1 to R3, and accordingly, through one round of the path, three electronic parts P1 to P3 can be once picked up and further three images can be obtained once from the three electronic parts P1 to P3 which are then mounted onto the circuit board 3 after their positions are compensated for positional deviations. Thus, only by one stroke of the transferring head 7, it is possible to cope with a plurality of electronic parts, thereby making it possible to efficiently recognize and mount the electronic parts.

According to the present invention, the light is concentrated in the viewing field of the line sensor so as to increase the volume of light incident upon the line sensor, and accordingly, a disadvantage caused by an insufficient volume of light can be eliminated, thereby making it possible to stably mount an electronic part through the recognition of an image at a high speed.

What is claimed is:

1. An apparatus for mounting an electronic part, comprising:

a means for positioning a circuit board;

a part feeder for feeding an electronic part;

a transferring head for removing an electronic part from said part feeder, and mounting the electronic part onto said circuit board; and an image reading device for observing an electronic part held and moved by said transferring head, said image reading device picking up an image from the electronic part so that the picked-up image is recognized so as to detect a position of the electronic part with which the motion of said transferring head is controlled;

said transferring head incorporating a nozzle for attracting an electronic part and a reflector for reflecting light, said reflector being located above the electronic part attracted by said nozzle and comprising a first part and a second part arranged symmetric with each other about said nozzle, said first part comprising first principal flat surfaces which face in one and the same first direction and are inclined relative to a horizontal direction, and said second part comprising second principal flat surfaces which face in one and the same second direction and are inclined relative to said horizontal direction; and said image reading device comprising:

a line sensor for observing from below the electronic part attracted by said nozzle;

a transmissive illuminating means having first and second illuminating means, which are located on opposite sides of said line sensor, for respectively emitting first and second band-like beams which widen in a direction parallel with the longitudinal direction of said line sensor, for irradiating from below said reflector passing above said line sensor;

a direct illuminating means for emitting a third band-like beam which widens in a direction parallel with the longitudinal direction of said line sensor, and for irradiating from below the lower surface of the electronic part passing above said line sensor;

wherein said first and second band-like beams from said first and second illuminating means of said transmissive illuminating means are irradiated upon said reflector while overlapping with each other at said reflector, said third band-like beam from said direct illuminating means is illuminated upon the lower surface of the electronic part and then said first, second and third band-like beams are reflected from said reflector and the lower surface of the electronic part and are introduced into said line sensor so as to pick up an image from the electronic part attracted by said transferring head.

2. An apparatus for mounting an electronic part comprising:

a means for positioning a circuit board;

a part feeder for feeding an electronic part;

a transferring head for removing an electronic part from said part feeder, and mounting the electronic part onto said circuit board, said transferring head including a nozzle for attracting an electronic part; and an image reading device for observing an electronic part held and moved by said transferring head, said image reading device picking up an image from the electronic part so that the picked-up image is recognized so as to detect a position of the electronic part with which the motion of said transferring head is controlled;

said image reading device comprising:

a line sensor for observing from below the electronic part attracted by said nozzle; and a transmissive illuminating means having first and second illuminating means, which are located on opposite sides of said line sensor, for irradiating from below said reflector passing above said line sensor; and said transferring head incorporating therein a reflector for reflecting light, said reflector being integrally mounted to said nozzle and comprising a first part and a second part arranged symmetric with each other about said nozzle, said first part including first principal surfaces which face in one and the same first direction and are inclined relative to a horizontal direction, and said second part comprising second principal surfaces which face in one and the same second direction and are inclined relative to said horizontal direction, for reflecting band-like beams emitted from said first illuminating means and said second illuminating means onto said line sensor, and said reflector being located at a position adapted to be above the electronic part attracted by said nozzle, wherein first and second band-like beams from said first and second illuminating means of said transmissive illuminating means are irradiated upon said reflector while overlapping with each other at said reflector, and said first and second band-like beams are reflected from said reflector and then are introduced into said line sensor so as to pick up a silhouette image from the electronic part attracted by said nozzle.

3. A method of mounting an electronic part in an electronic part mounting apparatus, said method comprising: providing a line sensor for observing from below an electronic part attracted and moved by a transferring head having a nozzle for attracting an electronic part; employing a transmissive illuminating means having first and second illuminating means arranged on opposite sides of said line sensor to emit first and second band-like beams which widen in a direction parallel to the longitudinal direction of said line sensor to irradiate from below a reflector passing above said line sensor while said first and second beams are overlapping with each other at said reflector, said reflector being integrally incorporated with said nozzle of said transferring head and having a first part and a second part arranged symmetric with each other about said nozzle, said first part including principal surfaces which face in one and the same first direction and are inclined relative to a horizontal direction, and said second part comprising second principal surfaces which face in one and the same second direction and are inclined relative to said horizontal direction, for reflecting said first and second band-like beams onto said line sensor;

rotating said reflector to set a direction of said reflector such that at least one of said first and second band-like beams emitted from said first and second illuminating means is reflected onto said line sensor;

moving the electronic part attracted by said nozzle of said transferring head across said line sensor so as to obtain a silhouette image from the electronic part;

detecting from said obtained image a positional deviation of said electronic part;

compensating the position of the electronic part in accordance with said positional deviation; and mounting said electronic part onto a circuit board.

4. An apparatus for mounting an electronic part, comprising:

a means for positioning a circuit board;

a part feeder for feeding an electronic part;

a transferring head for removing an electronic part from said part feeder, and mounting the electronic part onto said circuit board, said transferring head including a nozzle for attracting an electronic part; and an image reading device for observing an electronic part held and moved by said transferring head, said image reading device picking up an image from the electronic part so that the picked-up image is recognized so as to detect a position of the electronic part with which the motion of said transferring head is controlled;

said image reading device comprising:

a line sensor for observing from below the electronic part attracted by said nozzle; and a transmissive illuminating means having first and second illuminating means, which are located on opposite sides of said line sensor, for irradiating from below said reflector passing above said line sensor; and said transferring head incorporating therein a reflector for reflecting light, said reflector being integrally mounted to said nozzle and comprising a first part and a second part arranged symmetric with each other about said nozzle, said first part including first principal surfaces which face in one and the same first direction and are inclined relative to a horizontal direction, and said second part comprising second principal flat surfaces which face in one and the same second direction and are inclined relative to said horizontal direction, for reflecting beams emitted from said first illuminating means and said second illuminating means onto said line sensor, and said reflector being located at a position adapted to be above the electronic part attracted by said nozzle, wherein first and second beams from said first and second illuminating means of said transmissive illuminating means are irradiated upon said reflector while overlapping with each other at said reflector, and said first and second beams are reflected from said reflector and then are introduced into said line sensor so as to pick up a silhouette image from the electronic part attracted by said transferring head.

5. A method of mounting an electronic part in an electronic part mounting apparatus, said method comprising:

providing a line sensor for observing from below an electronic part held and moved by a transferring head having a nozzle for attracting an electronic part; employing a transmissive illuminating means having first and second illuminating means arranged on opposite sides of said line sensor to emit first and second beams to irradiate from below a reflector passing above said line sensor while said first and second beams are overlapping with each other at said reflector, said reflector being integrally incorporated with said nozzle of said transferring head and having a first part and a second part arranged symmetric with each other about said nozzle, said first part including first principal surfaces which face in one and the same first direction and are inclined relative to a horizontal direction, and said second part comprising second principal flat surfaces which face in one and the same second direction and are inclined relative to said horizontal direction, for reflecting beams emitted from said first illuminating means and said second illuminating means onto said line sensor, said reflector being located at a position adapted to be above the electronic part attracted by said nozzle;

rotating said reflector to set a direction of said reflector such that at least one of said first and second beams emitted from said first and second illuminating means is reflected onto said line sensor;

moving the electronic part attracted by said nozzle of said transferring head across said line sensor so as to obtain a silhouette image from the electronic part;

detecting from said obtained image a positional deviation of said electronic part;

compensating the position of the electronic part in accordance with said positional deviation; and mounting said electronic part onto a circuit board.

* * * * *